United States Patent [19]

Hingorani

[11] 4,331,882

[45] May 25, 1982

[54] METHOD AND MEANS FOR DETECTING SPURIOUS ELECTRICAL SIGNALS IN AN ELECTRICAL POWER SYSTEM

[75] Inventor: Narain G. Hingorani, Los Altos Hills, Calif.

[73] Assignee: Electric Power Research Institute, Inc., Palo Alto, Calif.

[21] Appl. No.: 130,733

[22] Filed: Mar. 17, 1980

[51] Int. Cl.³ .............................................. H02H 7/08
[52] U.S. Cl. .................................. 307/129; 361/111; 361/113; 324/78 F
[58] Field of Search ...................... 307/129, 3; 361/20, 361/21, 110, 111, 113; 324/78 F

[56] References Cited

U.S. PATENT DOCUMENTS

| | | | |
|---|---|---|---|
| 3,610,029 | 10/1971 | Carlson | 73/71.4 |
| 3,731,526 | 5/1973 | Games | 73/71.4 |
| 3,737,842 | 6/1973 | Bobrin | 340/4 R |
| 3,944,846 | 3/1976 | Thompson et al. | 307/129 |
| 3,970,897 | 7/1976 | Tamir et al. | 361/113 X |
| 4,125,884 | 11/1978 | Sun | 307/129 X |

Primary Examiner—Michael L. Gellner
Assistant Examiner—James L. Dwyer
Attorney, Agent, or Firm—Flehr, Hohbach, Test et al.

[57] ABSTRACT

Spurious subsynchronous and supersynchronous electrical signals in an electrical power system are detected rapidly and reliably by generating an electrical signal which is proportional to the power signal and rectifying the generated signal. The rectified signal includes a dc component and a component having a frequency equal to the difference of the contact power frequency and the spurious signal frequency. The component is readily identified by a tuned filter and detector whereby remedial action can be taken to eliminate the spurious signal.

4 Claims, 6 Drawing Figures

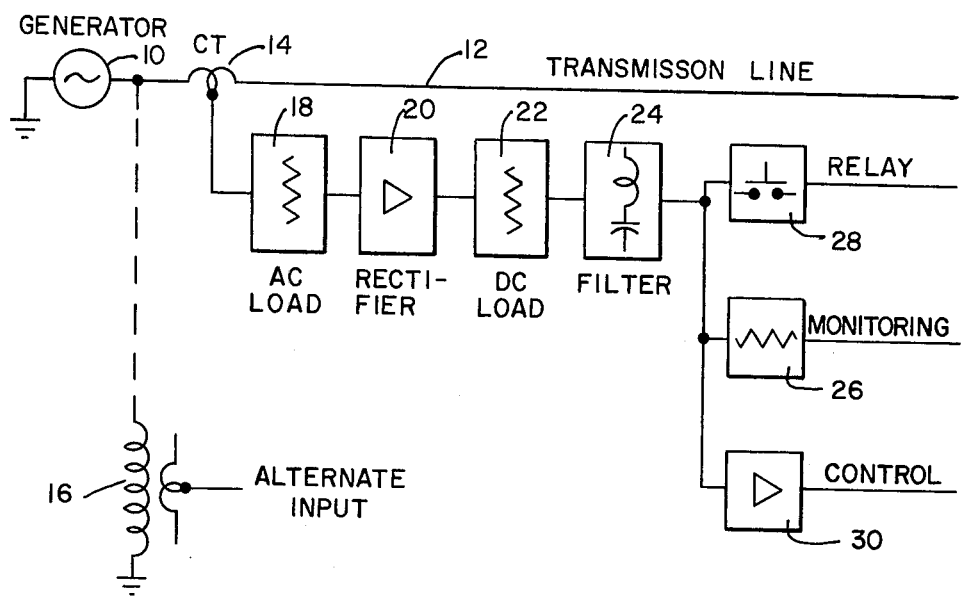
FIG.—1
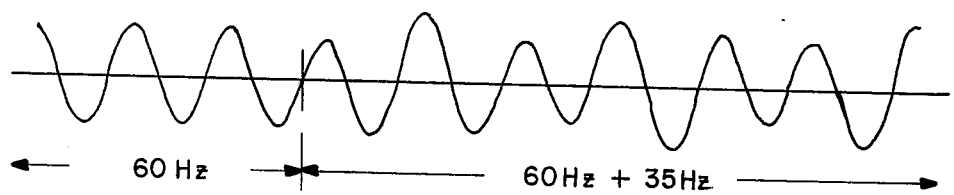
FIG.—2A
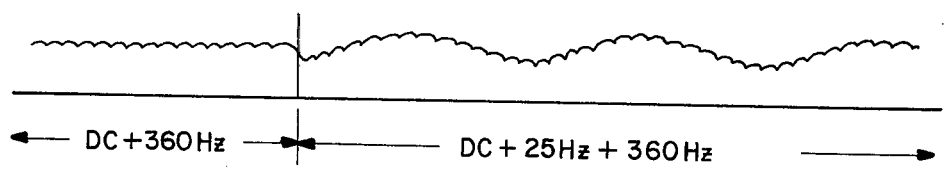
FIG.—2B

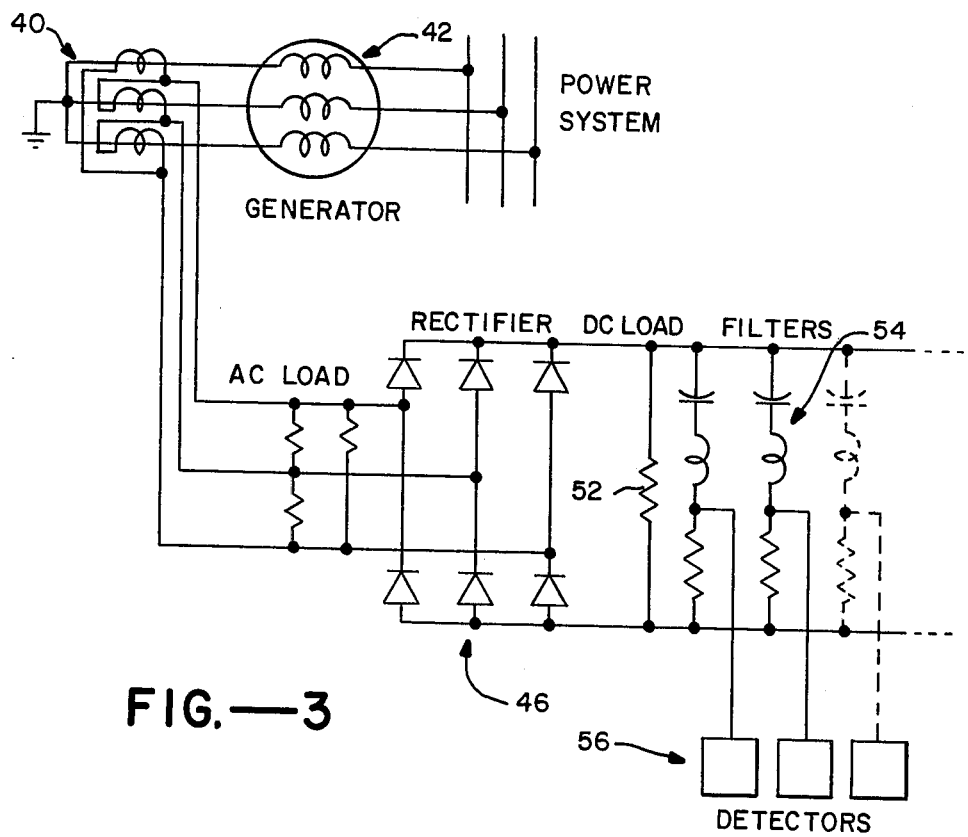
FIG.—3
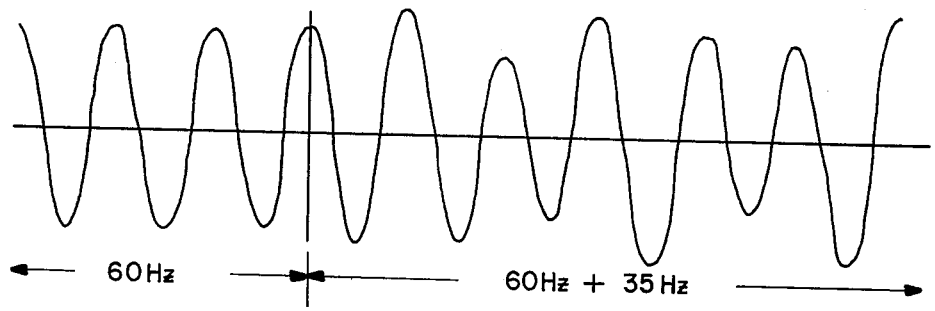
FIG.—4A
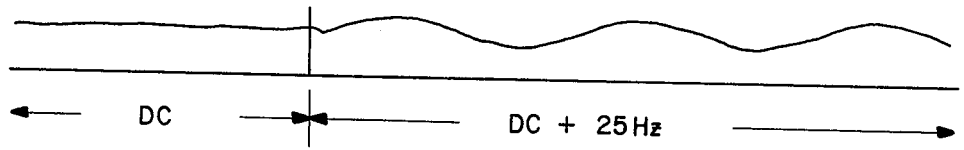
FIG.—4B

METHOD AND MEANS FOR DETECTING SPURIOUS ELECTRICAL SIGNALS IN AN ELECTRICAL POWER SYSTEM

This invention relates generally to electrical power systems, and more particularly the invention relates to a method and means for detecting spurious signals in the electrical power system.

Power systems are designed to operate at a fixed nominal frequency such as 50 hertz or 60 hertz. However, electrical and mechanical disturbances within the system can create spurious signals at resonant frequencies which can damage the system equipment. For a 60 Hz system, for example, particular frequencies of concern are known as subsynchronous frequencies which are below 60 hertz and supersynchronous frequencies which are between 60 hertz and 120 hertz. These frequencies result from mechanical and electrical interactions and for a given turbine-generator there are usually 1 to 5 such discrete frequencies in the subsynchronous range of from 5 to 55 hertz for a 60 hertz system. If the magnitude of these oscillations in the turbo-generator shaft become too large, they can cause damage in a matter of tens of milliseconds. Even when these oscillations are very small in magnitude, damage will result if the oscillations are allowed to continue for long periods of time.

Therefore, for a turbo-generator set, it is desirable to have a subsynchronous detection and monitoring system which can detect the existence of the discrete oscillations so that appropriate safety action can be initiated. One presently known device filters the ac current wave of the power system to filter out and detect the amplitude of the known spurious frequencies. For example, with a turbogenerator shaft having oscillations at subsynchronous frequencies, the frequencies on the electrical wave are 60 hertz plus or minus a mechanical oscillation frequency. Thus, for a 25 hertz mechanical oscillation, the spurious electrical frequency is 35 hertz and 85 hertz. Unfortunately, filtering and detecting of these frequencies from the ac current or voltage wave is often unreliable because of the small amplitude of these frequencies in a very large 60 hertz current or voltage. Another system is based on detecting mechanical vibrations on the turbo-generator machine shaft. This sytem has a problem of sensitivity in trying to detect vibrations of one degree or less in a shaft turning at 3600 revolutions per minute.

Accordingly, an object of the present invention is improved apparatus for detecting spurious signals in an electrical power system.

Another object of the invention is a method of detecting a spurious signal at a low frequency and with small amplitude in an electrical power system.

Briefly, apparatus in accordance with the present invention includes known means for generating an electrical signal proportional to a power signal in an electrical power system. The generated electrical signal is rectified thereby obtaining a rectified signal including a dc signal, a signal representing the difference in the constant system frequency and the frequency of the spurious signal, and signals with frequencies at multiples of the difference. Filter means receives and filters the rectified signal, and detector means detect the presence of a signal from the filter means thereby signifying the presence of a spurious signal.

The invention and objects and features thereof will be more readily apparent from the following detailed description and appended claims when taken with the drawings, in which:

FIG. 1 is a functional block diagram of apparatus for detecting spurious electrical signals in accordance with the present invention.

FIGS. 2A and 2B are electrical waveforms in the apparatus of FIG. 1.

FIG. 3 is an electrical schematic of three phase apparatus in accordance with one embodiment of the present invention.

FIGS. 4A and 4B are curves illustrating signals in the circuitry of FIG. 3.

Referring now to the drawings, FIG. 1 is a functional block diagram of apparatus for detecting spurious electrical signals in accordance with the present invention. The electrical power system includes a generator 19 which generates an electrical signal on the power line 12. As above described, the signal on power line 12 will include a constant frequency of 50 or 60 hertz and may include one or more spurious signals at subsynchronous or supersynchronous frequencies. A current transformer 14 is coupled to power line 12 for generating an electrical signal proportional to the power signal on line 12. Alternatively, a potential transformer 16 can be connected between power line 12 and system ground with the secondary coil of the potential transformer generating an electrical signal proportional to the voltage signal on line 12.

The generated signal from current transformer 14 is applied through a resistive ac load 18 and then to a rectifier 20. The rectified signal from rectifier 20 includes a dc signal, a signal representing the difference in the constant frequency of the power system and the frequency of a spurious signal and signals with frequencies at multiples of the difference. These signals are applied to a dc resistive load 22 and then to a filter and detector 24 for detecting the presence of a signal at the tuned frequency of the filter thus indicating the presence of a spurious signal. The output of filter detector 24 is applied through a monitor 26, and may be used to control a relay 28 for actuation of an alarm and as an input signal to control circuitry 30.

FIGS. 2A and 2B are curves illustrating the operation of the apparatus of FIG. 1. In FIG. 2A a 60 hertz signal is illustrated in the left portion of the signal and a 60 hertz signal with a 35 hertz spurious signal are represented on the right portion of the figure. FIG. 2B illustrates the corresponding curves across the dc load 22 of the apparatus of FIG. 1. For the pure 60 hertz signal the output current is dc and ac components at multiples of the 60 hertz signal. For example, in a three phase network the ac components are multiples of six times the system frequency or multiples of 360 hertz which decrease in magnitude with increasing frequencies. Importantly, no 60 hertz component is present in the dc load 22.

With a subsynchronous component of 35 hertz present, the signal across dc load 22 will contain the frequency difference of the constant system frequency and the spurious signal frequency or 25 hertz and integer multiples thereof with magnitudes decreasing with increasing frequency, as illustrated on the right side of FIG. 2B. Alternatively, with a supersynchronous component of 85 hertz the rectified signal will contain a component of 85−60=25 hertz and integer multiples thereof. Importantly, the 25 hertz signal and integer multiples thereof can be readily filtered and detected by the tuned filter and detector 24 since the large 60 hertz signal is absent in the output. Thus, subsynchronous oscillations, although small in amplitude, can be readily and rapidly detected.

FIG. 3 is a schematic of three phase apparatus in accordance with one embodiment of the invention. Three current transformers shown generally at 40 generate electrical signals proportional to the power signal from generator 42, and the three generated signals are applied through a resistive load shown generally at 44 to the three phase rectifier shown generally at 46. The output of rectifier 46 is passed through a dc resistive load 52. The signal generated across the dc load 52 is applied to a plurality of filters 54 which are tuned to pass signals at specific frequencies to the voltage detectors 56. The illustrated filters are simple serially tuned filters, however other filters well known in the art including active filters may be employed.

By providing the resistive load 44 before rectifier 46 the flow of the sixth harmonic and integer multiples thereof is further reduced from the dc sideload resistor 52. This is illustrated in the curves of 4A and 4B which are similar to the curves of FIGS. 2A and 2B but in which the output current for the sixty hertz signal is essentially a pure dc voltage as illustrated in FIG. 4B. Similarly, the output current for the spurious signal is essentially a dc current with the 25 hertz signal imposed thereon without additional higher frequency ripple. Thus, elimination of the 60 hertz signal along with its harmonic is evident from the curves through the provision of the ac resistance.

Various modifications of the circuitry will be obvious to those skilled in the art. For example, the midpoint of the rectifier output may be connected to the neutral of the three phase windings to allow any unbalanced current to flow. Alternatively, the current transformer windings may be connected in delta configuration. The system may be used to detect subsynchronous and supersynchronous spurious components in the system voltage. The current transformers may be located at a variety of locations, as suggested in FIG. 1, including at the generator transformers, along the power transmission line, at circuit breakers, or wherever the current flow may include subsynchronous and supersynchronous spurious components. The current transformers may be electromagnetic, electronic, Hall devices, and the like.

Thus, while the invention has been described with reference to a specific embodiment the description is illustrative of the invention and is not to be construed as limiting the invention. Various modifications and applications may occur to those skilled in the art without departing from the true spirit and scope of the invention as defined by the appended claims.

What is claimed is:

1. In an electrical power system for transmitting electrical current at a constant frequency, apparatus for detecting the presence of a spurious electrical signal comprising means for generating a signal proportional to an electrical signal in said system; means for rectifying said generated signal thereby obtaining a rectified signal including a dc signal, the signal having a frequency equal to the difference in said constant frequency and the frequency of said spurious signal, and signals with frequencies at multiples of said difference; filter means for receiving and filtering said rectified signal to remove d.c. and frequencies at integer multiples of said constant frequency; and voltage detector means connected to said filter means for detecting the presence of said difference in said constant frequency and the frequency of said spurious signal, said detector means output is indicative of a spurious electrical signal.

2. Apparatus as defined in claim 1 wherein said means for generating an electrical signal proportional to an electrical signal comprises at least one current transformer coupled to said power system.

3. Apparatus as claimed in claim 2 wherein said means for generating an electrical signal proportional to an electrical signal further includes resistive load means connected to receive current from said current transformer.

4. The method of detecting spurious electrical signals in an electrical power system comprising the steps of
generating a signal proportional to an electrical signal in said system,
rectifying said generated signal thereby obtaining a rectified signal including a dc signal, a signal having a frequency equal to the difference in the power system operating frequency and said spurious signal frequency, and signals with frequencies in multiples of said difference,
filtering said rectified signal to pass only a signal at frequency equal to said difference in power system operating frequency and the spurious signal frequency and signals with frequency in multiples of said difference, and of said difference thereby indicating a spurious signal.

* * * * *